United States Patent
Seniuk et al.

(12) 
(10) Patent No.: US 6,635,405 B1
(45) Date of Patent: Oct. 21, 2003

(54) PRINT QUALITY TEST STRUCTURE FOR LITHOGRAPHIC DEVICE MANUFACTURING

(75) Inventors: David Seniuk, Aylmer (CA); Marcel Boudreau, Ottawa (CA); Maxime Poirier, Hull (CA)

(73) Assignee: Bookham Technology, PLC, Abingdon (GB)

(*) Notice: Subject to any disclaimer, the term of this patent is extended or adjusted under 35 U.S.C. 154(b) by 81 days.

(21) Appl. No.: 09/667,620

(22) Filed: Sep. 22, 2000

(51) Int. Cl.[7] .............. G03C 5/04; G06K 9/74; G09B 9/08
(52) U.S. Cl. .......... 430/311; 430/30; 430/322; 430/396; 356/71; 356/392; 356/393; 382/144
(58) Field of Search ............ 430/30–396; 356/71–393; 382/144

(56) References Cited

U.S. PATENT DOCUMENTS

| | | | | |
|---|---|---|---|---|
| 5,123,743 A | * | 6/1992 | Feldman | 356/237.5 |
| 5,972,568 A | | 10/1999 | Seniuk et al. | 430/312 |
| 6,091,249 A | | 7/2000 | Talbot et al. | 324/751 |

* cited by examiner

*Primary Examiner*—Mark F. Huff
*Assistant Examiner*—Daborah Chacko-Davis
(74) *Attorney, Agent, or Firm*—Lahive & Cockfield, LLP

(57) ABSTRACT

Disclosed is a print quality test structure for devices manufactured by lithography. The test structure allows for visual inspection of the print quality of the device. The test structure decouples the effects of overexposure, underexposure and focus so that corrections can be made for future device manufacturing. By visually inspecting each device during lithography, devices of poor quality can be reworked, and costly testing on all devices can be avoided through device screening.

15 Claims, 2 Drawing Sheets

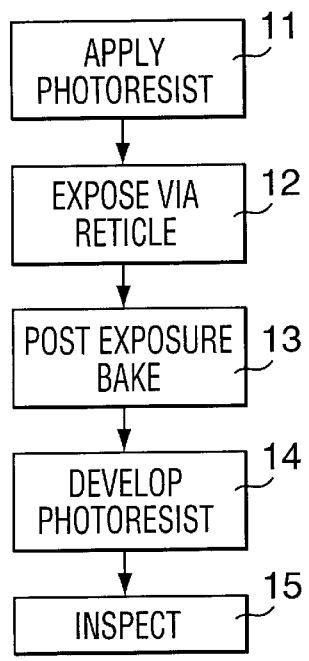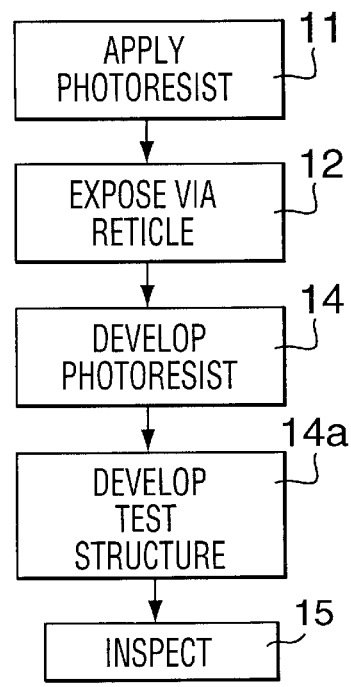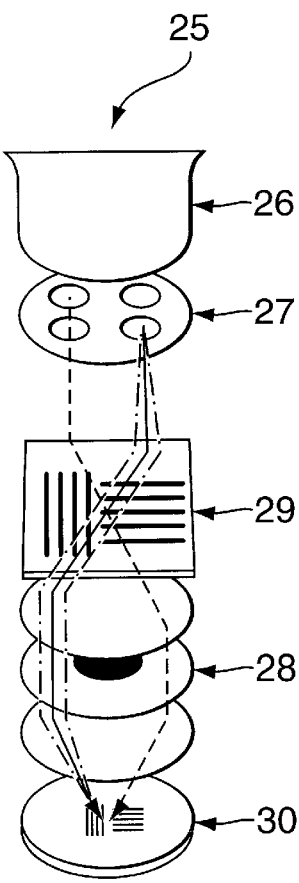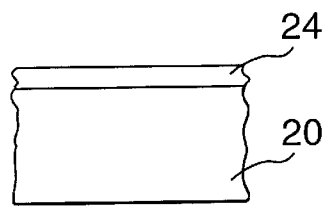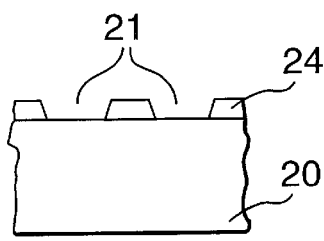
FIG. 1 PRIOR ART
FIG. 2
FIG. 5
FIG. 3 PRIOR ART
FIG. 4 PRIOR ART

PRINT QUALITY TEST STRUCTURE FOR LITHOGRAPHIC DEVICE MANUFACTURING

FIELD

The invention relates generally to the manufacture of devices such as semiconductors and more particularly to a print quality test structure for lithographic device manufacturing.

BACKGROUND

The process of manufacture of devices such as semiconductors includes processing of a silicon wafer by the repetition of a series of procedures including: oxidation, deposition, lithography, etching, implanting and diffusing. Tools used in the lithography stage generally include step and repeat type alignment and exposure apparatuses, called steppers, which have been used in device manufacturing. As is well known in the art, the exposure apparatus of this type is arranged such that an image of a pattern formed on a reticle is projected by a projection lens, in a reduced scale, onto a semiconductor wafer placed under the projection lens, while the semiconductor wafer is moved stepwise or intermittently, whereby discrete areas on the wafer are sequentially exposed to the images of the pattern of the reticle with a radiation such as light. By this, images of the pattern of the reticle are respectively transferred onto the discrete areas of the wafer.

Alternatively, other methods of transferring the images could be used. For example, a 1x lens could be used (no reduction). As well, a holographic apparatus could be used.

Depending on the level of production, the wafer may be inspected for lithography print quality (to detect defects) between the application of each layer. Intensive defect control during device manufacturing is important in order to maintain high print quality.

There are a number of methods and apparatuses available to assess print quality of the actual device. Scanning electron microscopy (SEM) analysis is one common method used. SEM is a method for high-resolution imaging of surfaces. The SEM uses electrons for imaging, much as a light microscope uses visible light. An incident electron beam is raster-scanned across the sample's surface, and the resulting electrons emitted from the sample are collected to form an image of the surface.

SEM analysis is costly and time consuming. It also generally requires surgery on a completed device, such as removing the metal, conducting microsurgery, cutting the device apart or polishing it.

Manufacturers of lithographic devices commonly create test patterns in order to assess the print quality. The test patterns are kept away from the working device since when the wafers are cut into chips, these test structures that were created lithographically are to be thrown away. There is no record of the print quality.

Other current methods of print quality assessment known in the art suffer from a variety of problems. The problem of tracing print quality to a critical dimension measurement in fabrication is difficult, if not impossible, on an individual device. Critical dimension tests must be done where the critical dimensions of the line are measured. Devices also undergo a separate focus test as well. And since there is no way to know ahead of time whether a device is good or bad, every device must be tested. Since testing procedures are generally about 4 or 5 hours per device, this results in a great deal of wasted time and cost.

These methods also suffer from the problem that they can not detect defects which are invisible from the surface. Devices are manufactured layer by layer and the layers themselves may get covered during fabrication of the device. For example, a layer of metal that overlaps everything printed below it may be used, no longer allowing for visual inspection.

Screening for defects is also a problem because in lithographic processes, it is impossible to ensure that every die on a single wafer is perfect everywhere. It is also impossible to inspect every die to ensure that it is perfect or even to assess the wafer in a proper manner. It would be too time consuming.

Current methods also do not decouple lithographic effects such as over exposure, under exposure, focus, 90 and 45 degree astigmatism.

Finally, other methods do not provide a permanent record of the print quality on the device.

Therefore, there exists a need for a print quality test structure for lithographic device manufacturing that overcomes the problems of current print quality assessment.

SUMMARY

The invention is directed to a print quality test structure for lithographic device manufacturing.

In one embodiment of the invention, there is provided a method of forming a lithographic device by a lithographic process. The process involves the projection and focussing of radiant energy passing through a reticle having a selected pattern thereon such as to expose photoresist material on a wafer surface to the selected pattern. The reticle also has a print quality configuration thereon capable of producing a test structure on the wafer surface in close proximity to the selected pattern or a selected portion thereof. The test structure is capable of being visually inspected to indicate the quality of the selected pattern which is formed on the wafer surface. The print quality configuration comprises a series of characters incrementing in size according to a binary pattern to a resolution exceeding the resolution capabilities of the lithographic process.

In another embodiment, there is provided a method of inspecting the print quality as defined by the exposure and the focus of the print of a lithographic device such as a semiconductor. The method comprises the step of visually inspecting the selected test structure on the wafer surface to determine the number of printed and visible dots relative to the number of printed and visible holes whereby to give an indication of print quality.

In another embodiment, there is provided a device manufactured by a lithographic process involving the projection and focussing of radiant energy passing through a reticle such as to expose photoresist material on a wafer surface to a selected conductor pattern, the reticle having a print quality configuration capable of producing a selected test structure on the wafer surface. The device comprises a wafer defining a surface; at least one layer on the wafer surface including at least one critical element in said selected conductor pattern, the critical element having a print quality dependent on the exposure and focus of the print; and a selected test structure providing a permanent visual indication of the print quality of the critical element fixed to a portion of the wafer surface adjacent the at least one critical element.

In another embodiment, there is provided a reticle used in the formation of a lithographic device such as a semiconductor by a lithographic process involving the projection and focussing of radiant energy passing through the reticle such as to expose photoresist material on a wafer surface to a selected conductor pattern. The reticle is characterized in that the reticle is provided with a print quality configuration capable of producing a selected test structure on the wafer, the test structure being capable of being visually inspected to indicate the quality of the formation of the device on the wafer surface.

In another embodiment, there is provided a step and repeat exposure apparatus used in the formation of a lithographic device comprising: a light source for providing radiant energy; a stage for supporting a wafer in a position to receive the radiant energy; and a reticle located intermediate the light source and the stage such that in use of the apparatus the radiant energy passes through the reticle such as to expose photoresist material on the wafer to a selected conductor pattern, the reticle being provided with a print quality configuration capable of producing a selected test structure on the wafer surface, the test structure being capable of being visually inspected to indicate the print quality of the selected pattern which is formed on the wafer surface.

Many advantages of the present invention have been identified, including:

Requiring only good devices to undergo tests, such as a focus test, thus allowing screening of devices to be more time and cost efficient;

Allowing the ability to trace print quality to a critical dimension measurement in fabrication;

Allowing the print quality to be assessed at any stage of manufacture;

Ability to decouple lithographic effects such as over exposure, under exposure, focus, 90 and 45 degree astigmatism;

Ability to leave a permanent visible record of the print quality;

Allowing use of the invention in other technologies to which a lithographic technique can be used such as HBTs, MESFETs, SAWs; and Eliminates the human errors resulting from current visual inspection methods.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

Embodiments of the invention will be described with reference to the accompanying drawings, wherein:

FIG. 1 shows a flow chart of a sequence of steps involved in a method of making lithographic devices;

FIG. 2 illustrates a typical apparatus used in the processing steps in the sequence of steps in the flow chart of FIG. 1;

FIGS. 3 and 4 illustrate, diagrammatically and not to scale, results of processing steps in the sequence of steps in the flow chart of FIG. 1;

FIG. 5 shows a flow chart of a sequence of steps involved in a method of making lithographic devices according to an embodiment of the invention;

Figure 6:
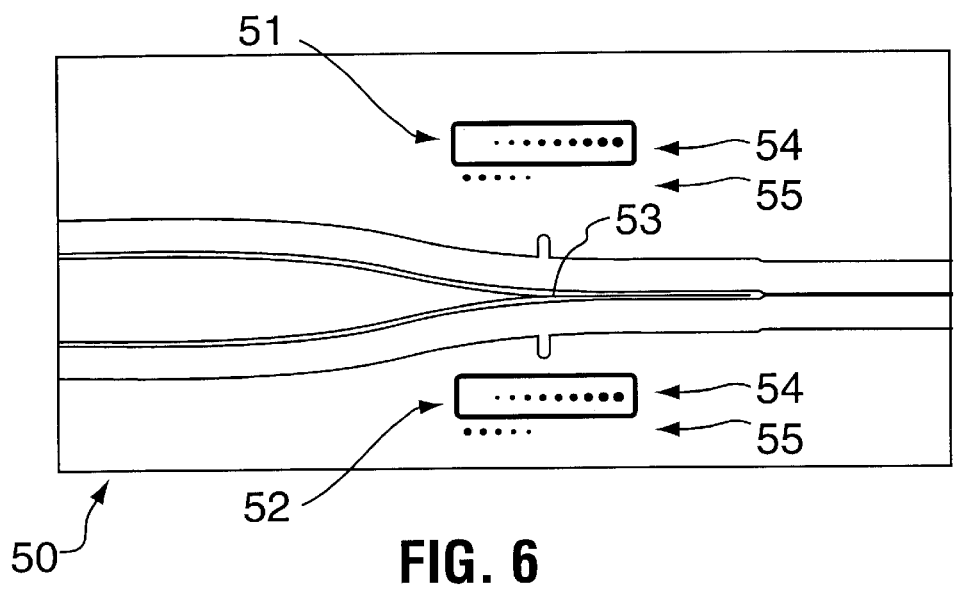
FIG. 6 illustrates a device with one critical layer with a print quality test structure.

Similar references are used in different figures to denote similar components.

DETAILED DESCRIPTION

A unique test structure that leaves a printed record of the lithographic print quality of the most critical layer or layers on every device that can be easily assessed with any microscope will be described hereafter. The test structure can be used for product screening during fabrication, verification, pre-packaging and on field returns.

Referring to FIG. 1 and FIG. 2, a method of forming a device manufactured by lithography comprises a sequence of steps 11 to 15 which are described below also with reference to FIGS. 3 and 4, which illustrate results following the processing steps 11 and 14 respectively. Although for simplicity this description refers to manufacture of a single layer device, it should be appreciated that it applies equally for a plurality of layers on the same wafer.

The apparatus 25 of FIG. 2 is used to carry out the method of FIG. 1. The apparatus 25 is generally referred to as a step and repeat exposure apparatus. The wafer 30 is sitting on a very precise stage (not shown) that moves relative to the step and repeat apparatus according to the desired pattern while the shutter opens and exposes each layer of the wafer.

In the step 11, a photoresist layer 24, which is sensitive to deep UV (ultraviolet) light from light source 26, is applied in known manner, resulting in the structure illustrated diagrammatically in FIG. 3. Prior to step 11, HMDS (Hexamethyldisilazane) wafer prime may be applied. HMDS promotes adhesion of the resist to the oxide on the wafer 30. Then a layer of photoresist is applied by spinning it onto the wafer 30.

In the step 12, the photoresist layer 24 is selectively exposed to light from light source 26 via a reticle 29 in a stepper. The reticle 29 is placed on top of a lens 28, for example a 5× lens. A 5× stepper in which the pattern on the reticle 29 from which the conductor pattern is produced is five times the size of the device pattern, can be used to provide high resolution (the image is 5× larger than what it would appear on the wafer 30). While a 5× lens is preferred, a 1×, 4× or 10× lens could also be used.

In the step 13, a post exposure bake follows.

The reticle 29 comprises a glass plate having a layer of chromium on it, selected portions of the chromium having been removed by an electron beam in accordance with the desired pattern (at the appropriate scale) of conductors to be subsequently formed on the piezoelectric substrate in the course of making the device. The exposed photoresist is removed by development in the step 14, resulting in the structure illustrated diagrammatically in FIG. 4 with gaps 21 in the photoresist layer 24 where conductors are to be formed on the substrate 20.

If desired, at this point, the image is inspected as step 15 and there is opportunity to strip the substrate and rework it if necessary. Otherwise, the etching process follows.

Referring to FIG. 5, according to an embodiment of the invention, a print quality test structure is formed during the lithography stage of manufacture of the device. Specifically, the test structure is formed while the semiconductor design is being formed. This step is illustrated as step 14a. Preferably, each critical element of a device corresponds to a test structure and preferably each test structure is in close proximity to its corresponding critical element. Preferably, the test structure comprises a series of characters incrementing in size according to a binary pattern, providing a visual overlap. Further, it is preferably designed to contain two rows of characters of opposite contrast. The first row contains printed dots on the reticle 29 mask that decrease in size from right to left. The next row contains printed holes on the reticle 29 mask that decrease in size from left to right. A hole is created by placing a hole in the photoresist such that on the masked image is a cleared out circle and exposure is through the hole. Then the resist is developed and it creates a hole in the resist. The other side of the resist does the opposite where it is an island resulting in a black dot which blanks out the exposure and in the resist it exposes everywhere except for where that black dot is. This becomes a dot or island of resist so it projects out as a three dimensional dot.

The stepper also has a numerical aperture 27 which is the physical size of the lens 28.

As light from light source 26 passes through a reticle 29, which is mostly glass with chromium on it, the chromium on the mask actually blocks light, but on the edges where light passes through, there is diffraction right off the edges of the chromium. The resolution limit of the lithography process is determined by the diffraction limit of the stepper's numerical aperture. The larger the numerical aperture, the more the diffraction patterns will be caught and reconstructed. Since, $$\text{Resolution} = k_1 \frac{\text{wavelength}}{2 * \text{numerical\_aperture}},$$

where $k_1$ represents the limitations of the resist processing, the resolution is limited by two features: by the diffraction limit of its numerical aperture and the wavelength of the light. So in this case, a high numerical aperture is desired in order to obtain the smallest character size. However, at some point the resolution will reach its limit. Since the print quality is defined by the exposure and the focus of the print, the stepper (the manufacturing tools used to print the device and the test structure at the same time) will not be able to resolve the smallest dots or holes and they will disappear at some point as their size becomes too small. Therefore, the number, size and overlap of dots and holes is indicative of the print exposure quality and print focus quality. Further, since each test structure is in close proximity to its corresponding critical element, the number of dots and holes is indicative of the print quality of the critical element. If the device is printed properly, a high number of holes and dots will be printed and the overlap will be greatest. If there are more holes and less dots, then the device was overexposed, while if there are less holes and more dots, the device was underexposed. In other words, if there is a shift in exposure such that the device is overexposed, the islands or dots will get smaller such that fewer dots are printed and more holes are printed. So an overlap does exist but it is shifting from left to right. This is indicative of not a resolution problem, but an exposure problem. When this is noticed, the device can be reworked and on the next wafer 30 the exposure can be adjusted.

The use of a visual check for overlap is quick, reliable and efficient. The inspector can flip across on a microscope and check for overlap using the print quality test structure. The following examples illustrate the above description of the print quality test structures. In the following examples, holes are distinguished by dots via a enclosed box.

Specifications can then be assigned to the number and position of existing dots derived from device sensitivities to lithographic print quality.

For example, FIG. 6 illustrates a device 50 with print quality test structures 51, 52 created by the above mentioned procedure. On this semiconductor, the dimension of the tip 53 is critical. Without a print quality test structure, the critical dimension has to be measured and it is very difficult to measure a curved structure such as this. As well it is virtually impossible to obtain a quantitative assessment of the print quality of the critical element. As illustrated, the test structures 51, 52 comprise a row of dots 55 and a row of holes 54. It is possible to include two test structures per element, although not necessary. A second test structure provides a second quality assessment that may be used as a "check" for the first. In this example, only one critical layer with a print quality test structure is illustrated. Test structures can be included on any critical area required provided they are not on top of each other. Since the test structures are not printed on the working part of the device 50, there is minimal chance of them being covered up during manufacture.

The example of FIG. 6 illustrates a device 50 manufactured with good quality exposure and focus since there is no shift in overlap (there is an equal number of holes and dots with overlap). The sensitivity of the test is high because the resolution of the stepper was exceeded (as illustrated by the holes and dots that did not print to the end).

For a device with two critical layers there would be two sets of test structures to maintain a record of how each one printed. In devices with multiple layers, it is possible to have multiple test structures on each layer. In this case, it is preferable to label each test structure (for example: L1 and L2) to distinguish them. Preferably, the dots are not placed on the working device, they are on the external surface area to it, but are subjected to the same processing. As well, preferably, test structures are placed in close proximity to where the critical characters are in the design.

Figure 7:
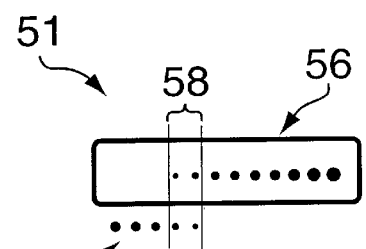
FIG. 7 illustrates a test structure for an overexposed device.
Figure 9:
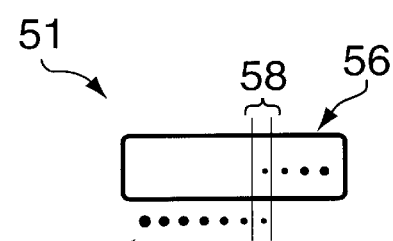
FIG. 9 illustrates a test structure for a device with poor focus quality.
Figure 8:
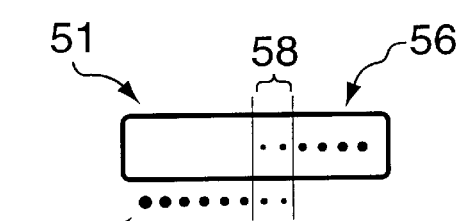
FIG. 8 illustrates a test structure for an underexposed device.

FIG. 7 illustrates a test structure 51 with more holes 56 and less dots 57, indicating that the device was overexposed. FIG. 8 illustrates a test structure 51 with less holes 56 and more dots 57, indicating the device was underexposed. In other words, FIGS. 7 and 8 illustrate a shift in the overlap 58 of holes and dots. FIG. 9 illustrates a test structure 51 for a device with poor focus quality. In this example, the holes 56 and dots 57 start to diverge and the overlap 58 decreases.

The size and number of the characters depends on the stepper being used to print it. It is advantageous to exceed the resolution of the stepper. In the example of FIG. 6, it is seen that it exceeded the limit of the stepper being used to print the device since there are dots and holes that go right to the end but did not all print. All the holes and dots can not print since the limits of the stepper were exceeded. So when the exposure and focus are correct, this is the best print possible and an overlap between the holes and the dots is visible. This quality will not improve unless a new stepper with a higher numerical aperture and better photoresist is used.

Exceeding the capabilities of the stepper increases the sensitivity of the print quality test structures, and therefore their ability to identify quality problems. If the capabilities of the stepper are met, then perfect or close to perfect overlap will result as seen in FIG. 7. However since the resolution was not exceeded, the test structure only indicates the quality with less sensitivity.

In one embodiment, the amount that the resolution is exceeded is influenced by how critical a particular element is. For a highly critical element, increased sensitivity in the print quality test structure is desired; therefore the limits of the stepper should be further exceeded.

The sensitivity of the print quality test structures can also be increased by decreasing the increment by which the character changes size. Again, the increment ratio can be adjusted depending upon how critical the particular element is. Ratios ca also be nonlinear, such as an exponential ratio.

By visually checking the test structures, it is possible to discover a defect in the device and rework the wafer 30 in order to correct the problem. However, it is possible that not every device in the field is going to be a good quality part. If there is a tilt in the focus, then instead of shooting a plane flat image onto the wafer 30, the image is tilted. This results in a device where good quality is shot in the center of the field, but on poor quality is shot on either end. This device can be reworked and the exposure/focus quality of the stepper corrected for future devices. But in the case of a curved field where the stepper lens 28 is imperfect, there exists a curved area image, referred to as "field curvature". There may be no way to correct the defect short of replacing the lens 28. However, it may still be possible to rework the devices in order to correct the defects. Therefore, with a test structure, it is possible to screen the devices so only good quality devices are chosen while bad quality devices are either disposed of or reworked. This eliminates the need to conduct costly and timely tests on all the devices.

The test structures can also be used as an early warning during the lithography stage of manufacture, so that the device can be reworked before being etched, at which point, the defective pattern can not be corrected. As soon as the image is printed in resist, there is opportunity to rework it. And since a test structure is more sensitive than the dimensional attributes of the device, it is possible to see a defect as it is creeping up and there is more opportunity to correct the defect.

The use of test structures eases the assessment of all optoelectronic devices at every stage of manufacture by leaving a visible record. For example, if after a part is shipped to a customer the part fails, it is possible to check the record of the print quality (the test structure) and determine if the part was shipped with good or bad quality to the customer.

The use of test structures can also be used in other technologies such as hetero-junction bipolar transistors (HBTs), metal-semi-conductor-field-effect-transistors (MESFETs), and surface acoustic wave devices (SAWs).

The use of dots and holes is a preferred embodiment since it provides a simple visual inspection means of the print quality, and since the dots indicate astigmatism problems in all directions by appearing oval instead of round.

Figure 10:
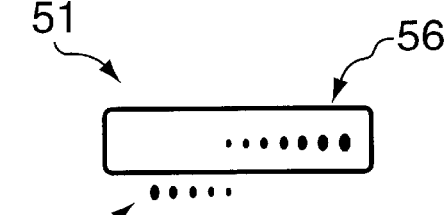
FIG. 10 illustrates a test structure for a device experiencing vertical astigmatism.
Figure 11:
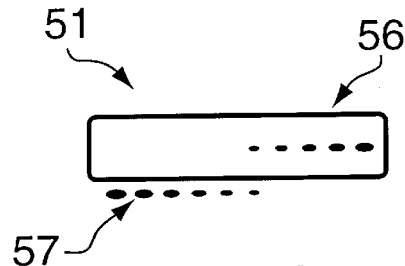
FIG. 11 illustrates a test structure for a device experiencing horizontal astigmatism.

Astigmatism occurs when there is a lens 28 aberration and both vertical and horizontal features are not projected at the same spatial focal plane. In this case, dots and holes are not created round. Noncircular dots and holes indicate an astigmatism problem. FIG. 10 illustrates a dot configuration indicating vertical astigmatism, wherein the dots appear as short vertical bars and FIG. 11 illustrates a dot configuration indicating horizontal astigmatism, wherein the dots appear as short horizontal bars. Dots and holes are effected equally.

When horizontal lines are printed on a first plane of focus and vertical lines printed on a second, it may not be possible to focus both planes. In this case, a compromise must be made between the quality of both planes. It may be best to provide good quality focus to the horizontal and poor quality to the vertical, or vice versa, or it may be best to provide average quality to both. This decision is dependent upon how critical each layer is. In any case, the print quality test structure can be used to ensure the quality achieved on each level is the quality desired at each level.

However, other binary patterns can be used. For example, elbows of varying size could be used to indicate the resolution limit in the same way. However, they would only show astigmatism in 90 degrees, whereas dots show astigmatism in 360 degrees. It is also possible to use line space pairs in one direction to indicate the resolution limit, but these would not indicate any astigmatism.

Also, the holes and dots could run in the same direction (both sets of characters increase in size in the same direction), providing for changing levels, but no overlap. Generally any binary pattern created to become smaller until it is not going to print somewhere can be used. With the pattern running in the same direction, it would be necessary to count and maximize each set of dots (get the highest number of dots). This will provide an indirect method of seeing overlap. However, the most dots possible to print in both contrasts is preferred. If the dots were laid out such that the biggest dots were at one end of both contrasts then it would be possible to count all the dots. If there is an equal amount on the holes and the islands, then the print quality is good.

The previously described embodiments of the present invention have many advantages including:

Since the test structure is visible with a microscope, it allows for cost and time efficient quality testing. Since all devices do not need to be tested, it helps in testing costs as well. Also because it is so sensitive, it can be used as an early warning inspection technique so that the device can be reworked during the lithography stage;

Minimizes the inspection and testing of the device at the lithography stage. Since it is known at this stage whether a device is of bad or good quality, only good quality devices need be tested;

By providing the test structure to each device, the print quality to a critical dimension measurement can be traced in fabrication; By placing the test structure on every layer, the invention is always visible at any stage of manufacture;

Since the test structure is visible with a microscope, an SEM is not required in order to measure the quality of the print. Lithographic quality can be seen without any interference with the device, limited to dot size;

By providing different configurations of the test structure, the effects of exposure from defocus can be decoupled. The preferred embodiment of the test structure indicates three things simultaneously: whether the device was over exposed, under exposed or out of focus;

The invention will ease the assessment of all optoelectronic devices at every stage of manufacture by leaving a visible record;

It allows more time efficient screening by having a record beside every device when it gets to the final test;

It minimizes errors caused by: human inspectors tiring or losing concentration, subjective judgements and comparisons between inspectors since the test structure provides for easy visual inspection; and The invention can be used in other technologies such as HBTs, MESFETs, or SAWs, where additional cost savings can be attained.

The foregoing description represents what are presently considered to be the most practical and preferred embodiments of the invention, but it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A method of forming a lithographic device by a lithographic process involving the projection and focusing of radiant energy passing through a reticle having a selected pattern, thereon such as to expose a photoresist material on a wafer surface to the selected pattern, wherein the reticle has a print quality configuration thereon capable of producing a test structure on the wafer surface in close proximity to the selected pattern or a selected portion thereof, the test structure being capable of being visually inspected to indicate the quality of the selected pattern which is formed on the wafer surface, the print quality configuration comprising a series of characters incrementing in size according to a binary pattern to a resolution exceeding the resolution capabilities of the lithographic process.

2. The method as defined in claim 1, wherein the test structure is formed as a permanent indication of the quality of the formation of the device.

3. The method as defined in claim 1, wherein the test structure is formed in close proximity to a critical element of the selected pattern.

4. The method as defined in claim 3, wherein the critical element and the test structure are formed during the same lithographic process.

5. The method as defined in claim 1, wherein the binary pattern comprises: first and second series of characters arranged adjacent to one another to form the test structure on the wafer surface.

6. The method of claim 5, wherein the first and second series of characters comprise first and second series of spaced dots and holes, respectively.

7. The method as defined in claim 6, wherein the first and second series of characters being organized in first and second rows adjacent to one another such that the number of visible dots relative to the number of visible holes appearing in the test structure in the course of visual inspection is indicative of print exposure and focus of the print.

8. The method as defined in claim 7, wherein the step of providing the binary pattern includes creating the row of dots comprising dots that decrease in size along one direction of the row and creating the row of holes comprising holes that increase in size along said one direction.

9. A method of inspecting the print quality, as defined by the exposure and the focus of the print, of a lithographic device such as a semiconductor as formed by the method of claim 1, comprising the step of visually inspecting the selected test structure on the wafer surface to determine the number of printed and visible dots relative to the number of printed and visible holes whereby to give an indication of print quality.

10. The inspection method as defined in claim 9, wherein a greater number of printed and visible holes than printed and visible dots indicates that the device was overexposed.

11. The inspection method as defined in claim 9, wherein a greater number of printed and visible dots than printed and visible holes indicates that the device was underexposed.

12. The inspection method as defined in claim 9, wherein a shift in printed and visible overlap between the row of dots and the row of holes indicates poor exposure quality.

13. The inspection method as defined in claim 12, wherein if the unequal printed and visible overlap is caused by the formation of more visible holes than dots, the test structure indicates that the device was overexposed.

14. The inspection method as defined in claim 9, wherein any printed and visible divergence in the overlap between the row of dots and the row of holes indicates poor focus quality.

15. The inspection method as defined in claim 9, wherein if the unequal printed and visible overlap is caused by the formation of more dots than holes, the test structure indicates that the device was underexposed.

* * * * *